US 6,392,473 B1

(12) United States Patent
Hanson et al.

(10) Patent No.: US 6,392,473 B1
(45) Date of Patent: May 21, 2002

(54) VOLTAGE PROTECTION AND BIASING CIRCUIT

(75) Inventors: Ryan Edwin Hanson; Tom P. Moyles, both of Livonia, MI (US)

(73) Assignee: Visteon GLobal tech., Inc., Dearborn, MI (US)

(*) Notice: Subject to any disclaimer, the term of this patent is extended or adjusted under 35 U.S.C. 154(b) by 0 days.

(21) Appl. No.: 09/481,222

(22) Filed: Jan. 11, 2000

(51) Int. Cl.[7] .......................... G05F 1/10; H03K 17/60
(52) U.S. Cl. ........................ 327/546; 327/432
(58) Field of Search ............................... 327/545, 546, 327/427, 80, 81, 374, 376, 377, 315, 432, 433

(56) References Cited

U.S. PATENT DOCUMENTS

| | | | |
|---|---|---|---|
| 3,938,000 A | 2/1976 | Higashide | |
| 4,829,259 A * | 5/1989 | Konopka | 320/21 |
| 4,835,416 A * | 5/1989 | Miller | 327/546 |
| 5,047,662 A | 9/1991 | Edwards | |
| 5,191,277 A * | 3/1993 | Ishikura et al. | 320/22 |
| 5,552,746 A | 9/1996 | Danstrom | |
| 5,744,984 A | 4/1998 | Drapac et al. | |
| 5,763,960 A * | 6/1998 | Ceccherelli et al. | 327/546 |
| 5,774,014 A * | 6/1998 | Stecker et al. | 327/546 |
| 5,796,276 A | 8/1998 | Phillips et al. | |
| 5,939,908 A | 8/1999 | Moore et al. | |

* cited by examiner

Primary Examiner—Toan Tran
(74) Attorney, Agent, or Firm—Visteon GLobal Tech., Inc.

(57) ABSTRACT

A biasing and transient protection circuit 10 which is used in combination with a field effect transistor 14 which selectively communicates a voltage signal which emanates from a battery 12 to a component or load 18. The circuit 10 selectively generates a substantially constant electrical voltage to bias the gate terminal 50 of the field effect transistor 14, effective to allow the field effect transistor 14 to allow the component or load 18 to operatively receive the battery voltage signal while concomitantly protecting the field effect transistor 14 from transient voltage damage.

18 Claims, 1 Drawing Sheet

VOLTAGE PROTECTION AND BIASING CIRCUIT

FIELD OF THE INVENTION

This invention relates to a voltage protection and biasing circuit and more particularly, to a circuit which allows voltage to be provided to a terminal of a transistor, effective to operatively bias the transistor while concomitantly protecting the transistor from damage which is caused by transient voltage surges or "spikes".

BACKGROUND OF THE INVENTION

Transistors, such as and without limitation field effect transistors, are used in many assemblies and/or devices to control the application or communication of electrical voltage to a component which is oftentimes referred to as "the load". For example, in vehicles, a device, such as a switch, is used in combination with a field effect transistor to selectively couple and/or communicate the voltage which emanates from the vehicle battery to a component or load, such as an interior convenience lamp or window activation motor. Particularly, the switch or device selectively biases or allows voltage to be applied to the gate terminal of the field effect transistor, effective to allow battery voltage to be communicated to the component or load through the source and drain terminals of the transistor.

While this arrangement adequately allow s the battery voltage to be selectively communicated to the component or the load, it suffers from some drawbacks. Particularly, the field effect transistor, in this arrangement, is typically biased by use of the vehicle battery (i.e., the battery voltage is selectively applied and/or communicated to the gate terminal of the field effect transistor) During periods of relatively high transient battery voltage surges, "spikes", or increases, the biasing voltage damages, destroys, or "punches through" the field effect transistor, thereby requiring repair and replacement of the transistor, undesirably increasing the overall vehicle maintenance costs, and potentially causing surge type damage to the other components of the vehicle. Typically, the load or component is protected against such "spikes" in one of several conventional and known manners.

Some circuit configurations are used to address this drawback. For example, a voltage divider circuit is typically coupled between the vehicle battery and the field effect transistor and is effective to reduce the amount of biasing voltage which is communicated and/or coupled to the gate terminal of the field effect transistor. However, the amount of such voltage reduction is limited by the amount of voltage which is required to be communicated to the field effect transistor in order to operatively bias the transistor. Hence, while this voltage reduction approach and circuit configuration is effective to protect the field effect transistor from some relatively small transient voltage increases or surges, it does not typically provide protection against large transient voltage increases.

Zener diodes are also connected to the vehicle battery and to the field effect transistor and are somewhat more effective to protect the field effect transistor against transient voltage increases or surges. However, these zener diodes are relatively costly and undesirably increase the overall complexity of the circuit.

There is therefore a need for a new and improved circuit to bias and protect a field effect transistor while concomitantly allowing a biasing voltage to be selectively coupled to the field effect transistor, thereby allowing the operatively biased field effect transistor to couple voltage from a battery to a component or a load.

SUMMARY OF THE INVENTION

It is a first object of the present invention to provide a new and improved circuit to bias and concomitantly protect a transistor against transient voltage increases or "spikes".

It is a second object of the present invention to provide a new and improved circuit to generate an electrical signal which has a certain first value which remains substantially constant as the battery produces voltage signals of varying voltage values.

According to a first aspect of the present invention, a circuit is provided for use in combination with a battery which is adapted to selectively generate a voltage, a component which is to selectively receive the voltage, and a field effect transistor which has a source terminal which is coupled to the battery, a drain terminal which is coupled to the device, and a gate terminal which selectively allows the voltage to be communicated from the battery to the component through the source and drain terminals. The circuit includes a substantially constant electrical current source; and a resistor which is coupled to the substantially constant electrical current source and which cooperates with the substantially constant electrical current source to provide a substantially constant amount of biasing voltage to the field effect transistor.

According to a second aspect of the present invention, a method is provided for allowing electrical voltage to be communicated from a battery to a device, the voltage varying between a first low value and a second higher value. The method including the steps of providing an electrical component which allows the electrical power to be communicated from the battery to the device when the electrical component receives an electrical signal having a certain value; creating the electrical signal; communicating the electrical signal to the electrical component; causing the communicated electrical signal to have and maintain the certain value when the voltage varies between the first low value and the second high value.

These and other aspects, features, and advantages of the present invention will become apparent from a reading of the following detailed description of the preferred embodiment of the invention and by reference to the following drawings.

DETAILED DESCRIPTION OF THE PREFERRED EMBODIMENT OF THE INVENTION

Figure 1:
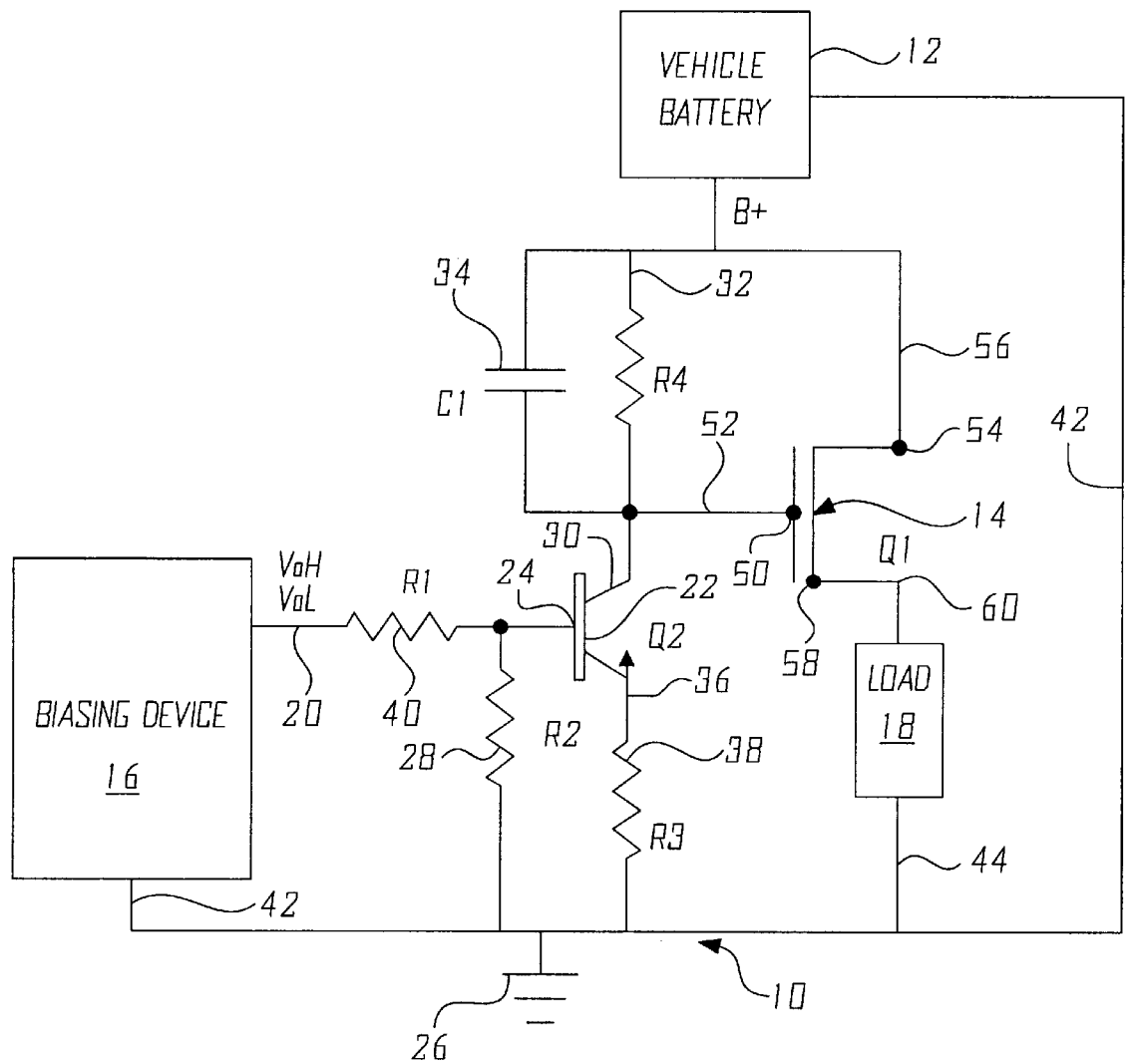
FIG. 1 is a schematic diagram of a biasing and protection circuit which is made in accordance with the teachings of the preferred embodiment of the invention and which is operatively coupled to a vehicle battery and to a component and/or load.

Referring now to FIG. 1, there is shown a voltage protection and biasing circuit 10 which is made in accordance with the teachings of the preferred embodiment of the invention. As shown, circuit 10 is operatively coupled to and used in combination with a vehicle battery 12 of the type which selectively generates a voltage signal (i.e., which generates electrical power), a component or load 18 which is to selectively receive the generated voltage signal or electrical power emanating from the vehicle battery 12 by use of an electrical component such as a field effect transistor 14, and a device or switch 16 which selectively activates the component or load 18 (i.e., which causes the voltage signal or electrical power which is generated and which emanates from the battery 12 to be communicated to the component or load 18). More particularly, controller or device 16 selectively generates a voltage signal upon bus 20 having one of two voltage values which, as is more fully delineated below, are typically used to activate or deactivate the component or load 18 (i.e., the term "deactivate" means to substantially prevent the voltage signal and electrical power emanating from the vehicle battery 12 from being communicated to the component or load 18). In one non-limiting embodiment, the voltage which is operatively used to operationally activate device 16 (i.e., to allow device 16 to operate in the foregoing manner) is supplied by battery 12.

Circuit 10 includes a transistor 22 (i.e., a bi-polar transistor of the p-n-p type) having a base terminal 24 which is coupled to a source of electrical ground potential 26 through resistor 28. Transistor 22 further has a collector terminal 30 which is coupled to a resistor 32 and a capacitor 34. Both capacitor 34 and the resistor 32 are coupled to the vehicle battery 12 and are arranged and connected, as should be apparent to those of ordinary skill in the art, in an electrical "parallel" manner or fashion. Transistor 22 further includes an emitter terminal 36 which is coupled to the source of electrical ground potential 26 by use of resistor 38. Bus 20 is coupled to resistor 28 and to the base terminal 24 by use of resistor 40, and device 16 and component or load 18 are each coupled to the source of electrical ground potential 26 by respective busses 42, 44. The vehicle battery 12 is also coupled to the source of electrical ground potential 26 by use of bus 46.

The gate terminal 50 of the field effect transistor 14 is coupled to the resistor 32 and to the collector terminal 30 by use of bus 52 while the source terminal 54 of the field effect transistor 14 is coupled to the vehicle battery 12 by use of bus 56. The drain terminal 58 of the field effect transistor 14 is coupled to the component or load 18 by use of bus 60.

In operation, when the voltage signal which is produced by the controller or device 16 and which appears on bus 20 is low (e.g., about zero volts), substantially no electrical current flows through resistor 32 and the voltage "drop" across the resistor 32 is substantially of zero volts. This voltage "drop" is applied to the gate terminal 50 and source terminal 54 of the field effect transistor 14, thereby substantially preventing the field effect transistor 14 from coupling voltage from the battery 12 to the load 18. The component or load 18 is therefore selectively deactivated.

When the voltage signal appearing on bus 20 and emanating from controller or device 16 is relatively high (e.g., about five volts), a voltage or potential is created across the base and emitter terminals 24, 36 which causes a relatively constant electrical current to be generated from the emitter terminal 36 of the transistor 22, thereby causing a substantially similar and substantially constant biasing current to flow into the collector terminal 30, effective to create a voltage signal across resistor 38. These currents and the created resistance voltage are, more particularly, created by the biasing of the transistor 22 by resistors 28, 38, 40 and the value of these currents and resistance voltage may be adjusted by varying the resistance values of resistors 28, 38, and 40. In one non-limiting embodiment of the invention, resistors 28, 38, and 40 have respective resistance values of 10,000 ohms, 1,800 ohms, and 10,000 ohms. In one non-limiting embodiment, resistor 32 has a resistance value of about 10,000 ohms and capacitor 34 has a capacitance value of 100 $\mu$Faruds.

The collector current flows through the resistor 32, thereby creating a substantially constant biasing voltage across the gate and source terminals 50 and 54 and allowing the voltage signal, which emanates from the vehicle battery 12, to be operatively communicated to the load or component 18 through the source and drain terminals 54 and 58.

The constant biasing current, emanating from the collector terminal 30 and which causes a constantly biasing voltage to be applied to the gate terminal 50 and the source terminal 54 of the field effect transistor 14, is substantially independent of and substantially unaffected by changes in the value of the voltage signal which emanates from the vehicle battery 12 (e.g., the value of the produced collector current and the biasing voltage across resistor 32 remains substantially constant even as the voltage which is output from the battery 12 changes). Hence the circuit 10 allows the field effect transistor 14 to be operatively biased and to be protected from relatively high transient battery voltage "spikes", increases, or values without the use of zener diodes and without "padding" the biasing voltage signal. Hence, the transient surges from battery 12 are not applied to the gate terminal 50 and the source terminal 54 and circuit 10 biases the field effect transistor 14 while concomitantly protecting the field effect transistor 14 against battery transient voltage surges or "spikes". Further it should be appreciated that capacitor 34 protects the field effect transistor 14 from "faster" or high frequency transient noise emanating from the battery 12. In other non-limiting embodiments, capacitor 34 is not used.

It is to be understood that the invention is not limited to the exact construction and method which has been illustrated and delineated above, but that various changes and modifications may be made without departing from the spirit and the scope of the inventions which are more fully described in the following claims.

What is claimed is:

1. A circuit for use in combination with a battery which is adapted to selectively generate a voltage, a first component which is to selectively receive the voltage, and a second component which allows the voltage to be communicated from the battery to said first component, said circuit comprising:

a substantially constant electrical source comprising a first transistor having a collector terminal which is coupled to a resistor and a base terminal which is coupled to a device;

said resistor being coupled to said substantially constant electrical current source and to said second component and which cooperates with said substantially constant electrical current source to provide a substantially constant amount of biasing voltage which is applied to said second component, effective to cause said voltage to be communicated from said battery to said first component; and a capacitor which is coupled to said battery and to said collector terminal of said first transistor and which is connected to said resistor in parallel fashion.

2. The circuit of claim 1 wherein said second component comprises a field effect transistor.

3. The circuit of claim 1 wherein said device is effective to cause said first transistor to generate and provide a substantially constant amount of electrical current from said collector terminal.

4. The circuit of claim 3 wherein said first transistor has an emitter terminal and wherein said circuit further comprises a second resistor which is coupled to said emitter terminal of said first transistor and to a source of electrical ground potential.

5. The circuit of claim 4 further comprising a third resistor which is coupled to said base terminal of said first transistor and to said source of electrical ground potential.

6. The circuit of claim 5 wherein said first transistor comprises a bi-polar transistor.

7. A circuit for use in combination with a field effect transistor of the type having a source terminal which is coupled to a battery which produces a first voltage and a second and substantially higher transient voltage, a drain terminal which is coupled to a component and which communicates at least the first voltage to the component, and a gate terminal, the circuit comprising:

a source providing a third voltage;

a resistor which is coupled to said source and which cooperates with said source to provide a first electrical current which has a value which is substantially independent of said value of said second voltage; and a first transistor which is coupled to said resistor and to said gate terminal and which uses said first electrical current to provide a second electrical current having a second value which is substantially independent of said value of said second voltage; and a second resistor which is coupled to said gate terminal, which receives said second electrical current, and which uses said second electrical current to produce a biasing voltage which has a certain value which remains substantially constant when said battery produces said first voltage and when said battery produces said substantially higher transient voltage.

8. The circuit of claim 7 wherein said first transistor comprises a bi-polar transistor.

9. The circuit of claim 7 further comprising a third resistor which is coupled to said first resistor and to an electrical ground potential.

10. The circuit of claim 9 wherein said first transistor has a base terminal and wherein said first and second resistors are coupled to said base terminal.

11. The circuit of claim 10 wherein said first transistor has a collector terminal and wherein said circuit further comprises a capacitor which is coupled to said collector terminal and to said battery.

12. The circuit of claim 11 wherein a selectively energizable courtesy light is coupled to said field effect transistor.

13. A method for allowing electrical voltage to be communicated from a battery to a first component, said voltage varying between a first low value and a second substantially higher value, said method comprising the steps of:

providing a second component which allows said electrical power to be communicated from said battery to said first component when said second component receives an electrical signal having a certain value;

providing a resistor and a first transistor having a collector terminal, and a base terminal;

providing a device and a capacitor;

coupling said collector terminal of said first transistor to said resistor;

coupling said base terminal to said device;

coupling said capacitor to said battery and to said collector of said first transistor and coupling said capacitor to said resistor parallel fashion;

creating said electrical signal;

communicating said electrical signal to said second component; and causing said communicated electrical signal to have and maintain said certain value when said voltage varies between said first low value and said second substantially higher value.

14. The method of claim 13 wherein said electrical component comprises a field effect transistor.

15. The method of claim 14 wherein said battery comprises a vehicle battery.

16. The method of claim 13 wherein said first low value is about twelve volts.

17. The method of claim 16 wherein said second high value comprises about forty-two volts.

18. The method of claim 15 wherein said first transistor comprises a bi-polar transistor.

* * * * *